(12) United States Patent
Beak et al.

(10) Patent No.: US 10,658,443 B2
(45) Date of Patent: May 19, 2020

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: Jung-Sun Beak, Paju-si (KR); Jung-Ho Bang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/799,763

(22) Filed: Oct. 31, 2017

(65) Prior Publication Data

US 2018/0122877 A1    May 3, 2018

(30) Foreign Application Priority Data

Oct. 31, 2016    (KR) .................. 10-2016-0143900

(51) Int. Cl.
| | | |
|---|---|---|
| *H01L 27/32* | (2006.01) | |
| *H01L 51/52* | (2006.01) | |
| *H01L 51/56* | (2006.01) | |
| *H01L 27/12* | (2006.01) | |

(52) U.S. Cl.
CPC ...... *H01L 27/3248* (2013.01); *H01L 27/3246* (2013.01); *H01L 27/3262* (2013.01); *H01L 27/3265* (2013.01); *H01L 27/3279* (2013.01); *H01L 51/5212* (2013.01); *H01L 51/5228* (2013.01); *H01L 51/56* (2013.01); *H01L 27/1255* (2013.01); *H01L 51/5218* (2013.01); *H01L 2227/323* (2013.01); *H01L 2251/301* (2013.01); *H01L 2251/308* (2013.01)

(58) Field of Classification Search
CPC .. H01L 27/3248; H01L 51/56; H01L 27/3246
See application file for complete search history.

(56) References Cited

U.S. PATENT DOCUMENTS

| | | | | |
|---|---|---|---|---|
| 2010/0045173 | A1* | 2/2010 | Kwon ................ | H01L 27/3246 313/504 |
| 2011/0006302 | A1* | 1/2011 | Yamazaki ......... | H01L 21/02565 257/43 |
| 2013/0099218 | A1* | 4/2013 | Lee .................... | H01L 51/5203 257/40 |

(Continued)

FOREIGN PATENT DOCUMENTS

| | | |
|---|---|---|
| KR | 10-2010-0022406 A | 3/2010 |
| KR | 10-2016-0007407 A | 1/2016 |
| KR | 10-2016-0009269 A | 1/2016 |

OTHER PUBLICATIONS

Korean Intellectual Property Office, Office Action, Korean Patent Application No. 10-2016-0143900, dated May 11, 2018, eight pages (with concise explanation of relevance).

*Primary Examiner* — Lex H Malsawma
*Assistant Examiner* — Xia L Cross
(74) *Attorney, Agent, or Firm* — Fenwick & West LLP

(57) ABSTRACT

Disclosed are an organic light emitting display device and a method of manufacturing the same. In the organic light emitting display, an anode connected to a thin film transistor and a bank disposed along the edge of the anode are simultaneously formed through one mask process, and a partition is formed to cover the side surface of the anode, thereby preventing damage to a pad cover electrode by an etching solution or etching gas of the anode without any separate pad protective film.

7 Claims, 15 Drawing Sheets

(56) References Cited

U.S. PATENT DOCUMENTS

2014/0312323 A1* 10/2014 Park .................. H01L 51/525
                                                                257/40
2016/0013438 A1*  1/2016 Im .................... H01L 51/5228
                                                                257/40

* cited by examiner

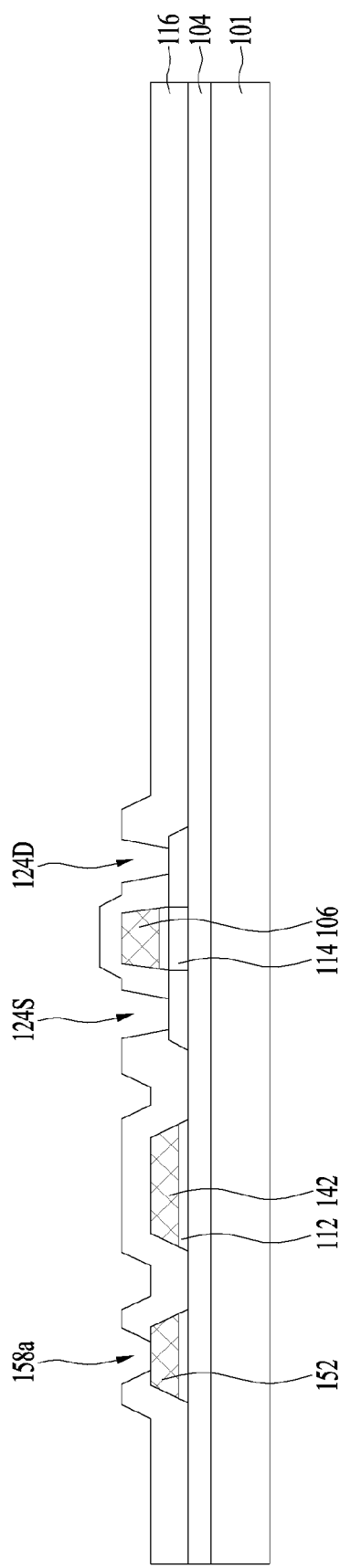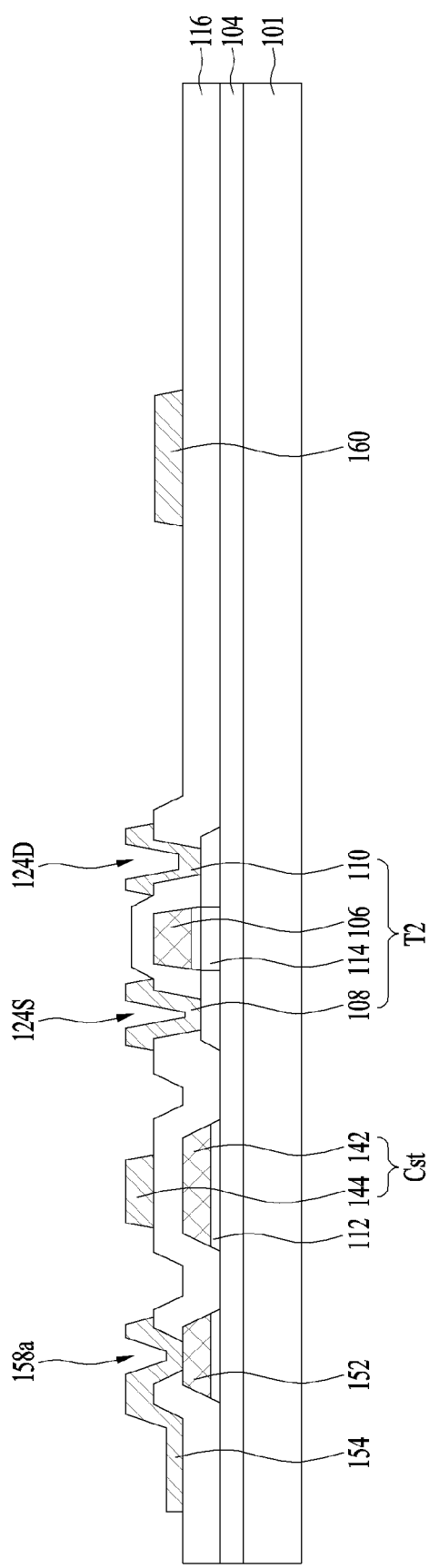

ORGANIC LIGHT EMITTING DISPLAY DEVICE AND METHOD OF MANUFACTURING THE SAME

CROSS-REFERENCE TO RELATED APPLICATIONS

This application claims the benefit of Republic of Korea Patent Application No. 10-2016-0143900, filed on Oct. 31, 2016, which is hereby incorporated by reference herein in its entirety.

BACKGROUND

Field of Technology

The present disclosure relates to an organic light emitting display device and a method of manufacturing the same, and more particularly, to an organic light emitting display device with simplified structure and manufacturing process and a method of manufacturing the same.

Discussion of the Related Art

Display devices, which display various pieces of information on a screen, are a core technology in the age of information and communication and have been developed to satisfy thinness, light-weight, portability and high-performance trends. As representative display devices, a liquid crystal display (LCD), an organic light emitting diode (OLED) display, etc. are used now.

In order to manufacture a display device, a mask process using a photomask is performed several times. In each mask process, sub-processes, such as cleaning, exposure to light, development, etching, etc., are carried out. Therefore, whenever one mask process is added, manufacturing time and manufacturing costs of the display device are raised and defect rate is increased, lowering the manufacturing yield. Therefore, an organic light emitting display device with simplified structure and manufacturing process to reduce manufacturing costs and to enhance manufacturing yield and production efficiency has been required.

SUMMARY

Accordingly, the present disclosure is directed to an organic light emitting display device and a method of manufacturing the same that substantially obviate one or more problems due to limitations and disadvantages of the related art.

An object of the present disclosure is to provide an organic light emitting display device with simplified structure and manufacturing process and a method of manufacturing the same.

Additional advantages, objects, and features of the disclosure will be set forth in the description which follows and will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, an organic light emitting display device includes thin film transistors disposed on a substrate, organic light emitting elements connected to the thin film transistors, a bank disposed along the edge an anode of each of the organic light emitting elements, and a partition disposed to cover the side surface of the anode.

In another aspect of the present disclosure, a method of manufacturing an organic light emitting display device includes forming thin film transistors disposed on a substrate, forming an anode connected to each of the thin film transistors and forming a bank disposed along the edge an anode, simultaneously, and forming a partition disposed to cover the side surface of the anode.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIGS. 5A to 5I are cross-sectional views illustrating a method of manufacturing the organic light emitting display device shown in FIG. 3.

DETAILED DESCRIPTION

Prior to description of the embodiments of the present disclosure, productivity decrease due to a mask process of a conventional organic light emitting display device will be exemplarily described below.

FIGS. 1A to 1D are cross-sectional views illustrating a method of manufacturing a conventional organic light emitting display device.

Figure 1A:
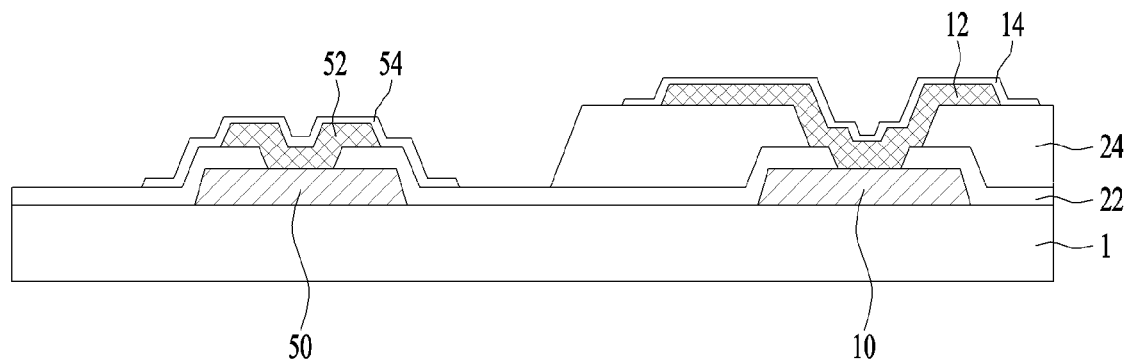
FIGS. 1A to 1D are cross-sectional views illustrating a method of manufacturing a conventional organic light emitting display device.

As exemplarily shown in FIG. 1A, a pixel cover electrode 14 disposed to cover a pixel connection electrode 12 contacting a drain electrode 10 and a pad cover electrode 54 disposed to cover a pad connection electrode 52 contacting a pad electrode 50 are formed on a substrate 1. Here, the pad connection electrode 52 is conductively connected to the pad electrode 50 exposed by a first insulating layer 22, and the pixel connection electrode 12 conductively connected to the drain electrode 10 exposed by the first and second insulating layers 22 and 24. And, the pixel cover electrode 14 and the pad cover electrode 54 are formed of a transparent conductive film having high corrosion resistance and high acid resistance.

Figure 1B:
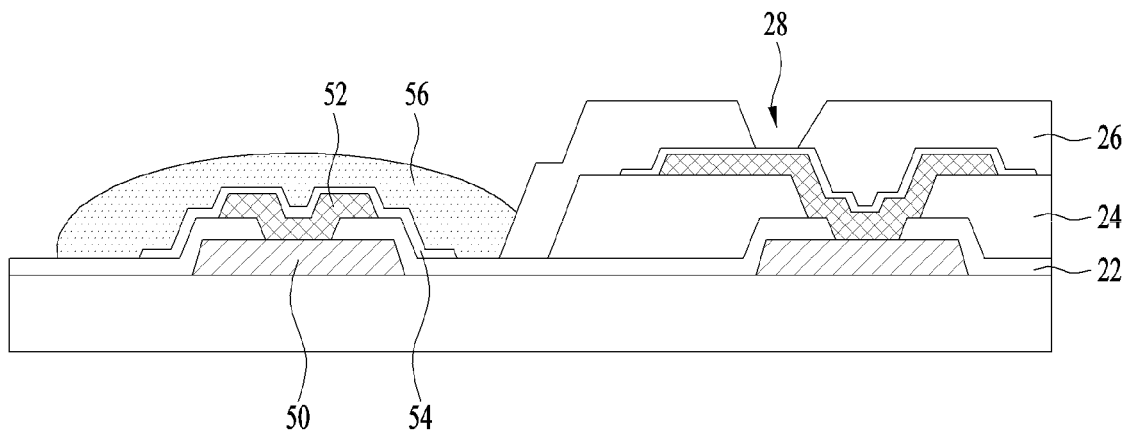

Thereafter, as exemplarily shown in FIG. 1B, a planarization layer 26 having a pixel contact hole 28 to expose the pixel cover electrode 14 is formed, and the pad protective film 56 to cover the pad cover electrode 54 is formed. Here, the pad protective film 56 is formed of a material which is removable by a strip solution subsequently used in a process of stripping a photoresist pattern used in formation of an anode 32.

Figure 1C:
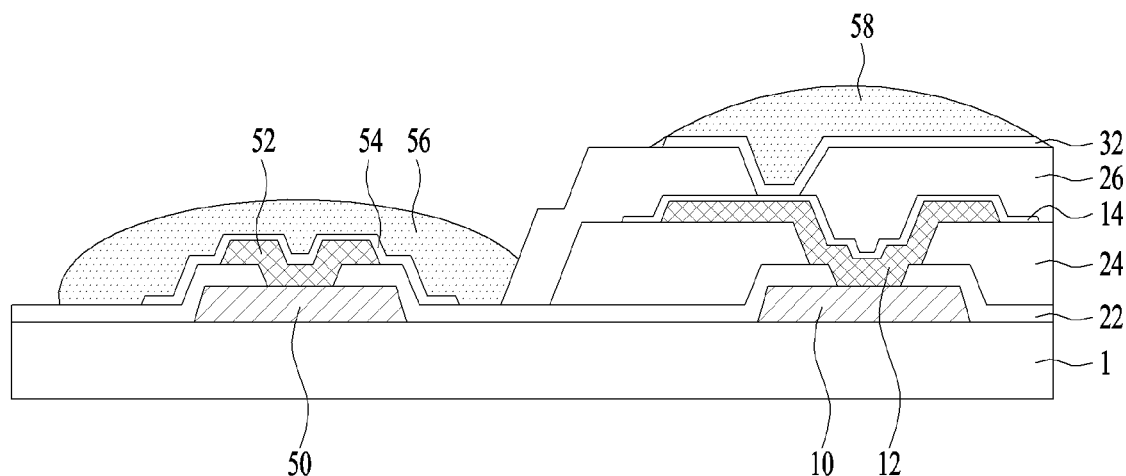

Thereafter, as exemplarily shown in FIG. 1C, the anode 32 connected to the pixel cover electrode 14 through the pixel contact hole 28 is formed. Here, if the anode 32 is applied to a front view type organic light emitting display device, the anode 32 has a structure in which a transparent conductive film and an opaque conductive film are stacked.

When the anode 32 is formed, the pad protective film 56 covers the pad cover electrode 54 and thus prevents the pad cover electrode 54 from being damaged by an etching solution used in formation of the anode 32.

Figure 1D:
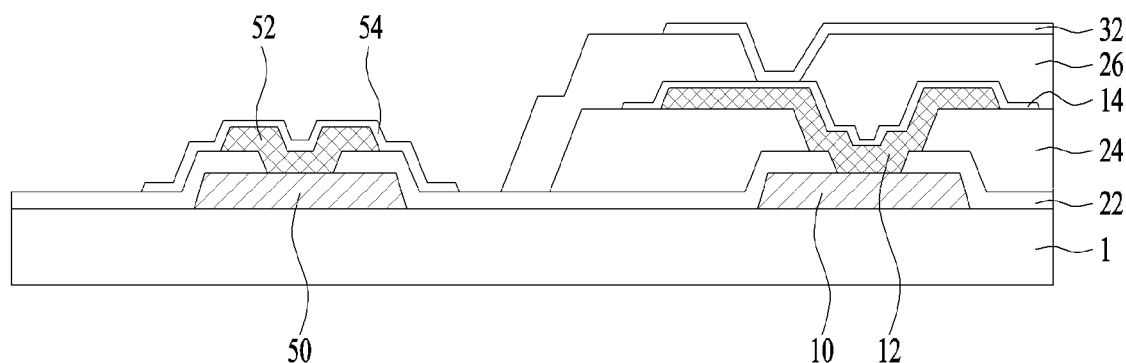

Thereafter, as exemplarily shown in FIG. 1D, a photoresist pattern 58 remaining on the anode 32 and the pad protective film 56 remaining on the pad cover electrode 54 are removed through the stripping process.

As such, in the conventional organic light emitting display device, the anode 32 includes the opaque conductive film which may be corrosive and, thus, it is difficult to simultaneously form the anode 32 and the pad cover electrode 54. Further, in the conventional organic light emitting display device, in order to prevent the pad cover electrode from being damaged by the etching solution used in formation of the anode 32, the pad protective film 56 to cover the pad cover electrode 54 should be separately formed.

Therefore, in the conventional organic light emitting display device, in order to form the pad cover electrode 54 and the pad protective film 56, the number of times that the mask process is performed is increased by at least two times and thus productivity is lowered and manufacturing costs are raised.

In order to solve these problems of the method of manufacturing the conventional organic light emitting display device, in a method of manufacturing an organic light emitting display device in accordance with the present disclosure, formation of a bank, an anode and a pad cover electrode and exposure of the pad cover electrode are simultaneously executed through one mask process and the number of times that the mask process is performed is decreased by at least three times and, thus, productivity is improved and manufacturing costs are reduced.

Reference will now be made in detail to the preferred embodiments of the present disclosure, examples of which are illustrated in the accompanying drawings.

Figure 2:
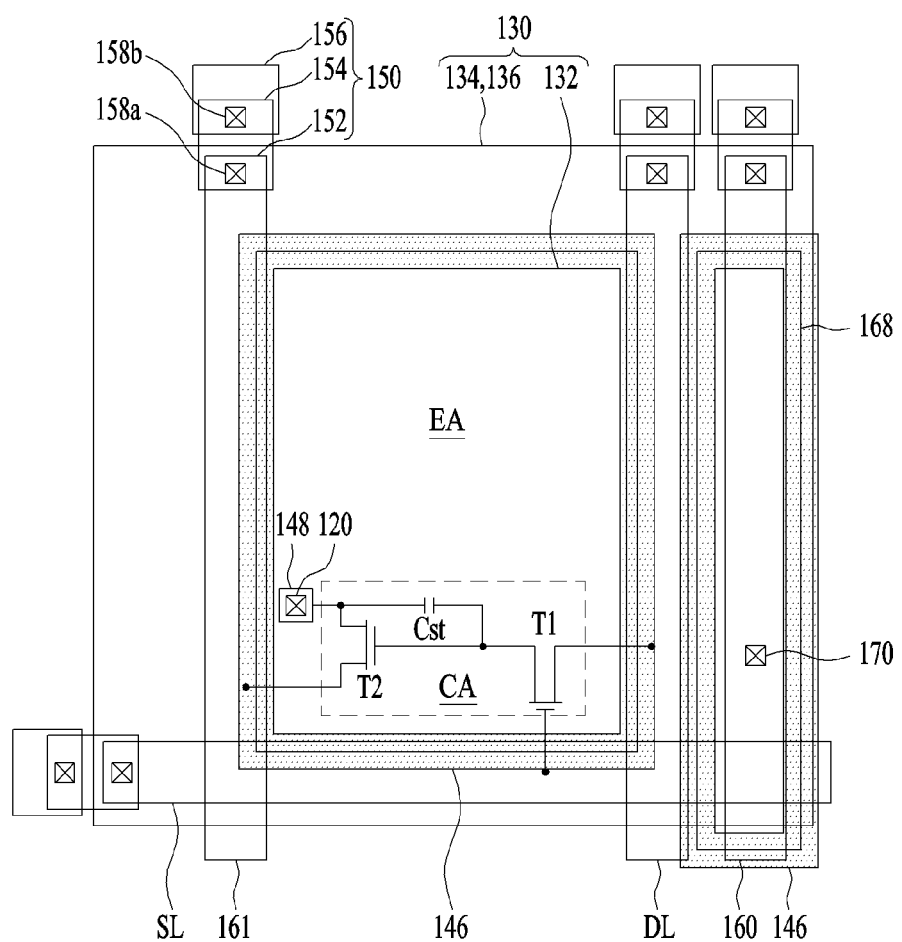
FIG. 2 is a plan view of an organic light emitting display device in accordance with one embodiment of the present disclosure.
Figure 3:
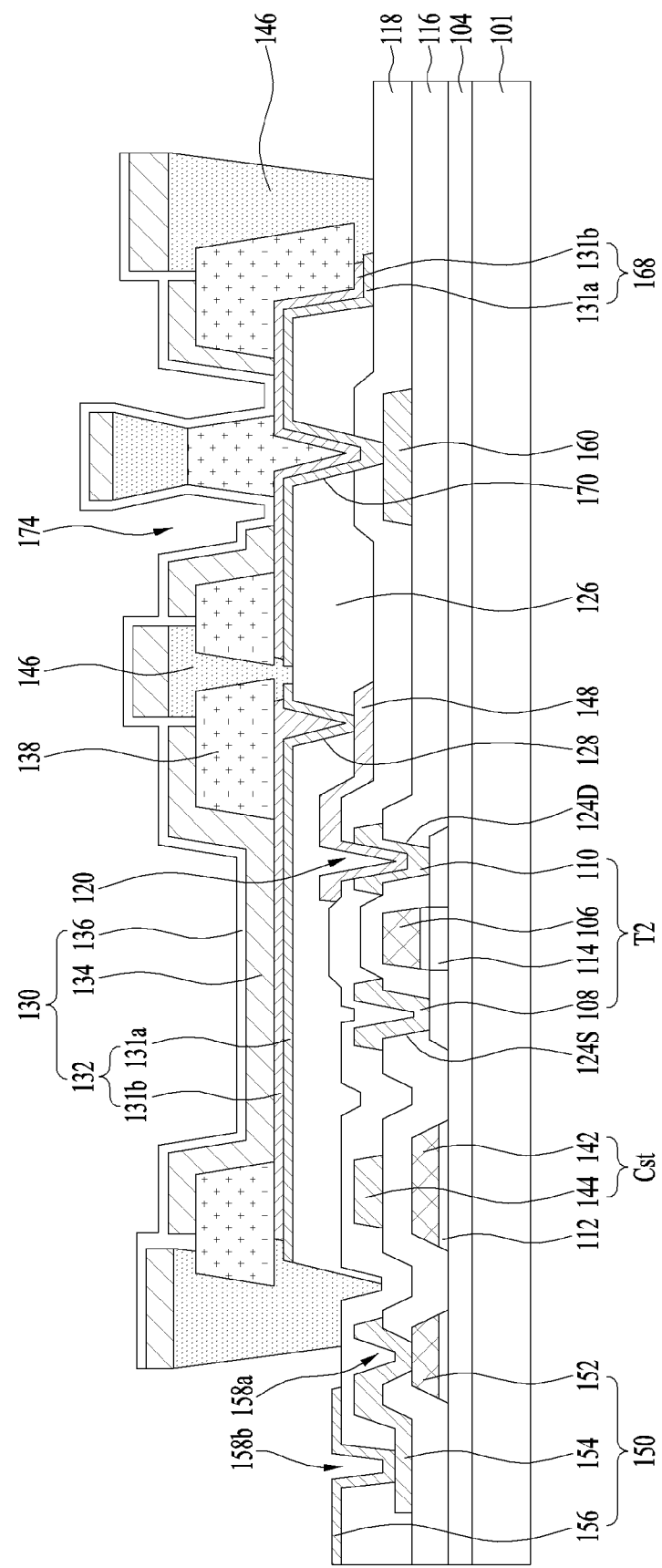
FIG. 3 is a cross-sectional view illustrating the organic light emitting display device shown in FIG. 2.
Figure 4:
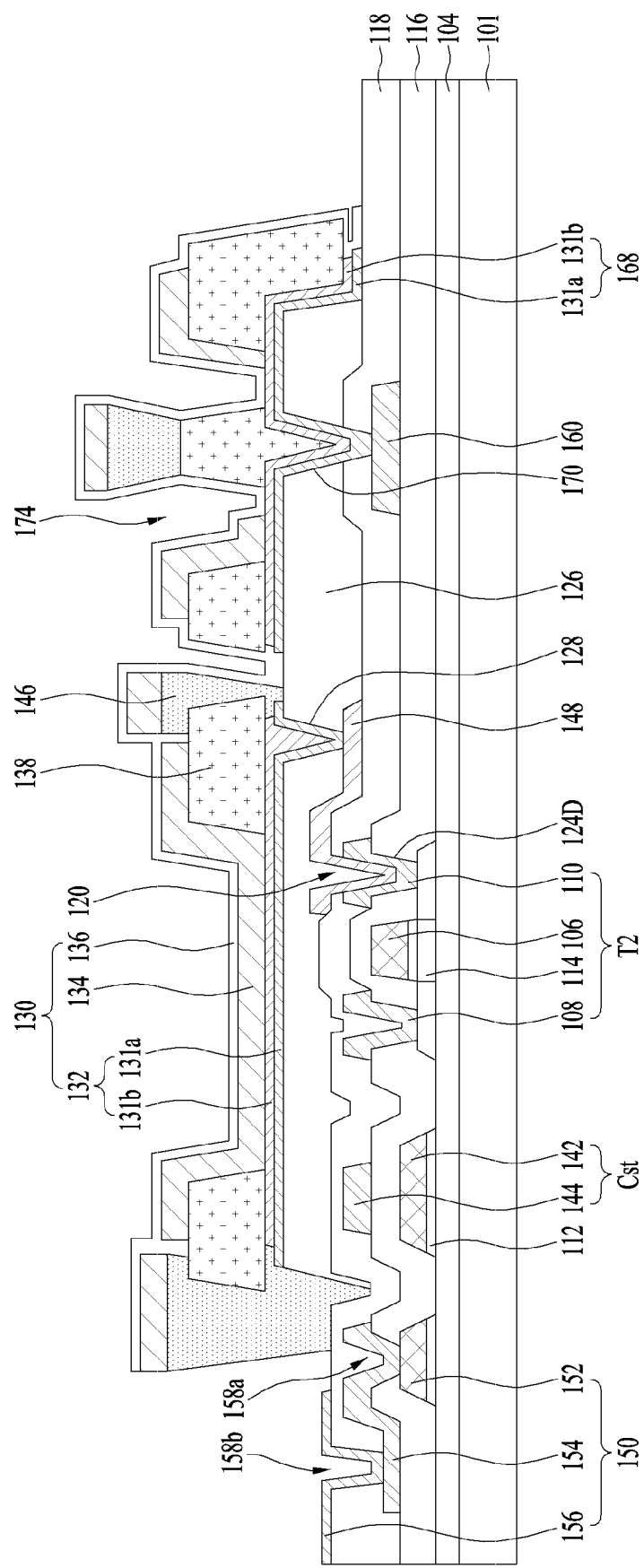
FIG. 4 is a cross-sectional view of an organic light emitting display device in accordance with another embodiment of the present disclosure.

FIG. 2 is a plan view of an organic light emitting display device in accordance with one embodiment of the present disclosure, and FIG. 3 is a cross-sectional view illustrating the organic light emitting display device shown in FIG. 2.

The organic light emitting display device shown in FIGS. 2 and 3 is provided with an active area and a pad area.

In the pad area, a plurality of pads 150 to respectively supply driving signals to scan lines SL, data lines DL, a high voltage (VDD) supply line 161 and a low voltage (VSS) supply line 160 is formed.

Each of the pads 150 includes a first pad electrode 152, a second pad electrode 154 and a pad cover electrode 156.

The first pad electrode 152 is formed of the same material as a gate electrode 106 on a gate insulating pattern 112 having the same shape as the first pad electrode 152.

The second pad electrode 154 is conductively connected to the first pad electrode 152 exposed through a first pad contact hole 158a formed through an interlayer insulating film 116. The second pad electrode 154 is formed of the same material as source and drain electrodes 108 and 110 on the interlayer insulating film 116 formed in the same layer as the source and drain electrodes 108 and 110.

The pad cover electrode 156 is conductively connected to the second pad electrode 154 exposed through a second pad contact hole 158b formed through a protective film 118. The pad cover electrode 156 is formed of the same material as a lower conductive film 131a included in an anode 132.

In the active area, a plurality of sub-pixels is arranged in a matrix and thus an image is displayed. Each of the sub-pixels arranged in the active area includes a pixel driving circuit disposed in a circuit area CA and a light emitting element 130 connected to the pixel driving circuit.

The pixel driving circuit includes a switching transistor T1, a driving transistor T2 and a storage capacitor Cst.

The switching transistor T1 is turned on when a scan pulse is supplied to the scan line SL, and supplies a data signal supplied to the data line DL to the storage capacitor Cst and a gate electrode of the driving transistor T2.

The driving transistor T2 controls current I supplied from the high voltage supply line 161 to the light emitting element 130 in response to the data signal supplied to the gate electrode of the driving transistor T2, thus adjusting an amount of light emitted from the light emitting element 130. Further, even if the switching transistor T1 is turned off, the driving transistor T2 supplies constant current I due to voltage charging the storage capacitor Cst until a data signal of a next frame is supplied, and thus maintains emission of light from the light emitting element 130.

For this purpose, the driving transistor T2, as exemplarily shown in FIG. 3, includes the gate electrode 106, the source electrode 108, the drain electrode 110 and an active layer 114.

The gate electrode 106 is formed on the gate insulating pattern 112 having the same shape as the gate electrode 106. The gate electrode 106 overlaps a channel area of the active layer 114 under the condition that the gate insulating pattern 112 is interposed there between. The gate electrode 106 may have a single layer structure including one selected from the group consisting of molybdenum (Mo), aluminum (Al), chrome (Cr), gold (Au), titanium (Ti), nickel (Ni), neodymium (Nd) and copper (Cu) or an alloy thereof or have a multilayer structure including the same, but the present disclosure is not limited thereto.

The source electrode 108 is connected to a source region of the active layer 114 through a source contact hole 124S formed through the interlayer insulating film 116. The drain electrode 110 is connected to a drain region of the active layer 114 through a drain contact hole 124D formed through the interlayer insulating film 116. Further, the drain electrode 110 is exposed through a first pixel contact hole 120 formed through the protective film 118 and is thus connected to a pixel connection electrode 148.

The source electrode 108 and the drain electrode 110 may have, for example, a single layer structure including one selected from the group consisting of molybdenum (Mo), aluminum (Al), chrome (Cr), gold (Au), titanium (Ti), nickel (Ni), neodymium (Nd) and copper (Cu) or an alloy thereof or have a multilayer structure including the same, but the present disclosure is not limited thereto.

The active layer 114 is provided with the source region and the drain region which are opposite each other across a channel region interposed therebetween. The channel region overlaps the gate electrode 106 under the condition that the gate insulating pattern 112 is interposed therebetween. The source region is connected to the source electrode 108 through the source contact hole 124S, and the drain region is connected to the drain electrode 110 through the drain contact hole 124D. Each of the source region and the drain region is formed of a semiconductor material doped with an n-type or p-type impurity, and the channel region is formed of a semiconductor material doped with no n-type or p-type impurity.

A buffer film 104 and a light shielding layer (not shown) are formed between the active layer 114 and the substrate 101. The light shielding layer is formed on the substrate 101 to overlap the channel region of the active layer 114. Such a light shielding layer absorbs or reflects light incident from the outside and may thus minimize light incident upon the channel region. Here, the light shielding layer may be exposed through a buffer contact hole (not shown) formed through the buffer film 104 and be conductively connected to the active layer 114. The light shielding layer is formed of an opaque metal, such as Mo, Ti, Al, Cu, Cr, Co, W, Ta or Ni.

The buffer film 104 has a single layer structure or a multilayer structure formed of silicon oxide or silicon nitride on the substrate 101 formed of glass or plastic resin, such as polyimide (PI). The buffer film 104 prevents diffusion of moisture or impurities generated from the substrate 101, or adjusts a transfer speed of heat in crystallization, thus serving to facilitate crystallization of the active layer 114.

The storage capacitor Cst is formed by overlapping a storage lower electrode 142 and a storage upper electrode 144 each other while interposing the interlayer insulating film 116 therebetween. Here, the storage lower electrode 142 is formed of the same material as the gate electrode 106 in the same layer as the gate electrode 106, and the storage upper electrode 144 is formed of the same material as the source electrode 108 in the same layer as the source electrode 108. Even if the switching transistor T1 is turned off, the driving transistor T2 supplies constant current I due to voltage charging the storage capacitor Cst until a data signal of a next frame is supplied, and thus maintains emission of light from the light emitting element 130.

The light emitting element 130 includes the anode 132 connected to the drain electrode 110 of the driving transistor T2, at least one organic light emitting stack 134 formed on the anode 132, and a cathode 136 formed on the organic light emitting stack 134.

The anode 132 is disposed on the planarization layer 126 to overlap an emission area EA prepared by a bank 138 and the circuit area CA provided with the pixel driving circuit.

The anode 132 has a structure in which a lower conductive film 131a and an upper conductive film 131b are sequentially stacked, in the same manner as an auxiliary connection electrode 168. Here, the side surfaces of the bank 138 and the lower conductive film 131a of each of the anode 132 and the auxiliary connection electrode 168 protrude more than the side surface of the upper conductive film 131b of each of the anode 132 and the auxiliary connection electrode 168. The lower conductive film 131a is formed of a material which is not corroded by oxygen and moisture, even if the lower conductive film 131a is exposed to the outside, and is not damaged during etching of the upper conductive film 131b. For example, the lower conductive film 131a may be formed of one selected from the group consisting of molybdenum-titanium (MoTi), titanium (Ti), tantalum (Ta) and combinations thereof. The upper conductive film 131b has a multilayer structure including a transparent conductive film and an opaque conductive film having high reflection efficiency. The transparent conductive film is formed of a material having a comparatively high work function value, such as indium-tin-oxide (ITO) or indium-zinc-oxide (IZO), and the opaque conductive film is formed to have a single layer structure or a multilayer structure including Al, Ag, Cu, Pb, Mo, Ti or an alloy thereof. For example, the upper conductive film 131b may be formed to have a structure in which a transparent conductive film, an opaque conductive film and a transparent conductive film are sequentially stacked, or a structure in which a transparent conductive film and an opaque conductive film are sequentially stacked.

The anode 132 is conductively connected to the drain electrode 110 through the pixel connection electrode 148. Here, the pixel connection electrode 148 contacts the drain electrode 110 through the first pixel contact hole 120 formed through the protective film 118. Further, the pixel connection electrode 148 contacts the anode 132 through a second pixel contact hole 128 formed through the planarization layer 126. On the other hand, the anode 132 may contact the drain electrode 110 through a pixel contact hole formed through the protective film 118 and the planarization layer 128 without a separate pixel connection electrode 148.

The organic light emitting stack 134 is formed by stacking a hole relating layer, an organic light emitting layer and an electron relating layer on the anode 132 in regular order or in reverse order. For example, the organic light emitting stack 134 may include first and second light emitting stacks disposed opposite each other under the condition that a charge generation layer is interposed therebetween. In this case, an organic light emitting layer of one of the first and second light emitting stacks generates blue light, and an organic light emitting layer of the other of the first and second light emitting stacks generates yellowish green light, thus producing white light through the first and second light emitting stacks.

If the organic light emitting stack 134 is applied to a front view type organic light emitting display device, the organic light emitting stack 134 is formed on the anode 132 disposed not only in the emission area EA prepared by the bank 138 but also in the circuit area CA, and thus an aperture ratio is improved.

The bank 138 is formed on the anode 132 to prepare the emission area EA. The bank 138 may be formed of an opaque material (for example, a black material) to prevent optical interference between neighboring sub-pixels. In this case, the bank 138 may be formed of a light-shielding material including at least one of a color pigment, an organic black pigment and carbon.

The organic light emitting stack 134 is separated from another organic light emitting stack 134 disposed in a neighboring sub-pixel generating light of a different color from the color of light emitted from the former organic light emitting stack 134 through a partition 146. That is, the partition 146 has a reverse tapered shape, the width of which is gradually increased from the lower surface thereof to the upper surface thereof, and is disposed in a bank hole 174 overlapping the auxiliary connection electrode 168. Therefore, the organic light emitting stack 134 grown to have straightness is not formed on the auxiliary connection electrode 168 overlapping the partition 146 and, thus, the organic light emitting stacks 134 of the neighboring sub-pixels emitting light of different colors are separated from each other within the bank hole 174 by the partition 146. In this case, the organic light emitting stack 134 is formed in a remaining region except for the auxiliary connection electrode 168 exposed by the bank hole 174 and is thus formed only on the upper surface of the anode 132 exposed by the bank 138, the upper surface of the partition 146 and the upper and side surfaces of the bank 138. On the other hand, the cathode 136 having better step coverage than the organic light emitting stack 134 is formed on the upper and side surfaces of the partition 146 and the side surface of the bank 138 disposed under the partition 146 and thus contact between the cathode 136 and the auxiliary connection electrode 168 is facilitated.

The cathode 136 is formed on the upper and side surfaces of the organic light emitting stack 134 and the bank 138 to be opposite the anode 132 under the condition that the organic light emitting stack 134 is interposed therebetween. If the cathode 136 is applied to a front view type organic light emitting display device, the cathode 136 is formed of a transparent conductive film, such as indium-tin-oxide (ITO) or indium-zinc-oxide (IZO).

The cathode 136 is connected to the low voltage supply line 160 in the bank hole 174, in which the partition 146 is located, through the auxiliary connection electrode 168. The auxiliary connection electrode 168 is conductively connected to the low voltage supply line 160 exposed through an auxiliary contact hole 170 formed through the protective film 118 and the planarization layer 128. Here, the low voltage supply line 160 is formed of a data metal layer having higher conductivity than the cathode 136 and may thus compensate for high resistance of the cathode 136 formed of a transparent conductive film, such as indium-tin-oxide (ITO) or indium-zinc-oxide (IZO).

The low voltage supply line 160 is formed of the same material as the storage upper electrode 144 on the interlayer insulating film 116 which is coplanar with the storage upper electrode 144. The low voltage supply line 160 is exposed through the auxiliary contact hole 170 formed through the protective film 118 and the planarization layer 126 and is connected to the auxiliary connection electrode 168.

The bank 138 of the present disclosure is formed along the edge of each of the anode 132 and the auxiliary connection electrode 168, as exemplarily shown in FIG. 3. The bank 138 protrudes more than the side surface of each of the anode 132 and the auxiliary connection electrode 168. In this case, an undercut is formed between the side surface of each of the anode 132 and the auxiliary connection electrode 168 and the bank 138. The partition 146 is formed to cover the side surfaces of the anode 132 and the auxiliary connection electrode 168 having an undercut structure, as exemplarily shown in FIG. 3, thereby preventing electrical short circuit between the side surface of the anode 32 and the cathode 136. In this case, the cathode 136 contacts the upper surface of the auxiliary connection electrode 168 exposed by the bank 138.

Otherwise, the partition 146 may be formed to cover the side surface of the anode 132 having an undercut structure but may not be formed on the side surface of the auxiliary connection electrode 168 having an undercut structure. In this case, the side surface of the anode 132 is not conductively connected to the cathode 136 by the partition 146 and, thus, electrical short circuit between the anode 132 and the cathode 136 may be prevented. Further, since the side surface of the auxiliary connection electrode 168 having an undercut structure and the upper surface of the auxiliary connection electrode 168 exposed by the bank 138 are conductively connected to the cathode 136, a contact area between the auxiliary connection electrode 168 and the cathode 136 is increased and thus high resistance of the cathode 136 may be lowered.

FIGS. 5A to 5I are cross-sectional views illustrating a method of manufacturing the organic light emitting display device shown in FIG. 3.

Figure 5A:
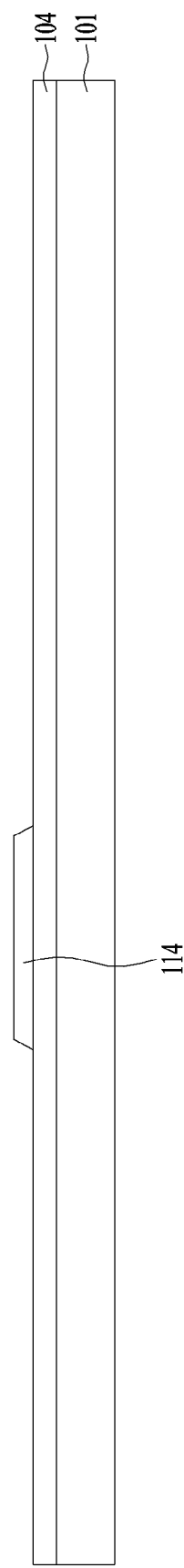

As exemplarily shown in FIG. 5A, a buffer film 104 is formed on a substrate 101, and an active layer 114 is formed on the buffer film 104.

In more detail, the buffer film 104 is formed by depositing an inorganic insulating material, such as $SiO_x$ or $SiN_x$, on the entire surface of the substrate 101. Thereafter, an amorphous silicon thin film is formed on the substrate 101 provided with the buffer film 104 through a method, such as low pressure chemical vapor deposition (LPCVD) or plasma enhanced chemical vapor deposition (PECVD). Thereafter, a polysilicon thin film is formed by crystallizing the amorphous silicon thin film. Thereafter, the polysilicon thin film is patterned through a photolithography process and an etching process using a first mask, thus forming the active layer 114.

Figure 5B:
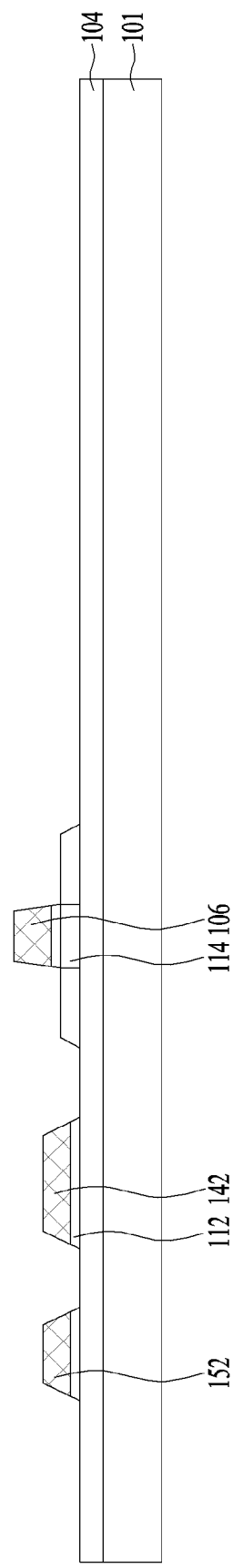

With reference to FIG. 5B, a gate insulating pattern 112 is formed on the buffer film 104 provided with the active layer 114, and a gate electrode 106, a storage lower electrode 142 and a first pad electrode 152 are formed on the gate insulating pattern 112.

In more detail, a gate insulating film is formed on the buffer film 104 provided with the active layer 114, and a gate metal layer is formed thereon through a deposition method, such as sputtering. An inorganic insulating material, such as $SiO_x$ or $SiN_x$, is used as the gate insulating film. The gate metal layer is formed to have a single layer structure including a metal selected from the group consisting of Mo, Ti, Cu, AlNd, Al, Cr and an alloy thereof or to have a multilayer structure including the same. Thereafter, the gate metal layer and the gate insulating film are simultaneously patterned through a photolithography process and an etching process using a second mask, thereby forming the storage lower electrode 142, the gate electrode and the first pad electrode 152 and forming the gate insulating pattern 112 being the same shape as the storage lower electrode 142, the gate electrode and the first pad electrode 152 thereunder.

Thereafter, an $n^+$-type or $p^-$-type impurity is injected into the active layer 114 using the gate electrode 106 as a mask, thus forming source and drain regions of the active layer 114.

With reference to FIG. 5C, an interlayer insulating film 116 provided with source and drain contact holes 124S and 124D and a first pad contact hole 158a is formed on the substrate 101 provided with the gate electrode 106, the storage lower electrode 142 and the first pad electrode 152.

In more detail, the interlayer insulating film 116 is formed on the substrate 101 provided with the gate electrode 106, the storage lower electrode 142 and the first pad electrode 152 through a deposition method, such as PECVD. Thereafter, the interlayer insulating film 116 is patterned through a photolithography process and an etching process using a third mask, thus forming the source and drain contact holes 124S and 124D and the first pad contact hole 158a. The source and drain contact holes 124S and 124D and the first pad contact hole 158a are formed through the interlayer insulating film 116, thus exposing a source electrode 108, a drain electrode 110 and a first pad electrode 152.

With reference to FIG. 5D, the source electrode 108, the drain electrode 110, a storage upper electrode 144, a second pad electrode 154 and a low voltage supply line 160 are formed on the interlayer insulating film 116 provided with the source and drain contact holes 124S and 124D and the first contact hole 158a.

In more detail, a data metal layer is formed on the interlayer insulating film 116 provided with the source and drain contact holes 124S and 124D and the first contact hole 158a through a deposition method, such as sputtering. The data metal layer is formed to have a single layer structure including a metal selected from the group consisting of Mo, Ti, Cu, AlNd, Al, Cr and an alloy thereof or to have a multilayer structure including the same. Thereafter, the data metal layer is patterned through a photolithography process and an etching process using a fourth mask, thus forming the source electrode 108, the drain electrode 110, the storage upper electrode 144, the second pad electrode 154 and the low voltage supply line 160 on the interlayer insulating film 116 on the interlayer insulating film 116.

Figure 5E:
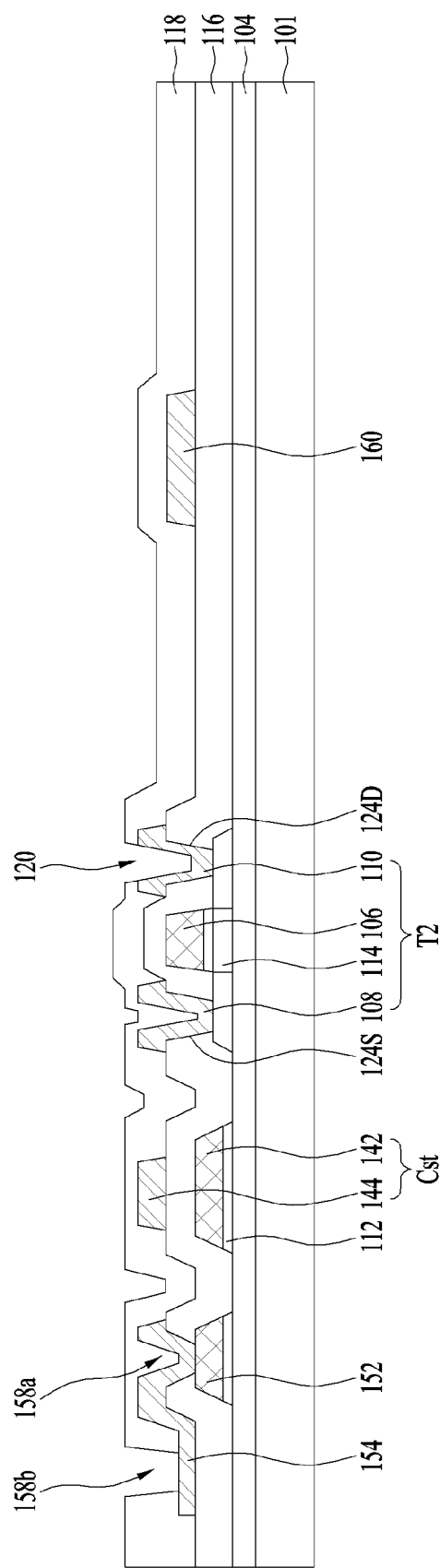

With reference to FIG. 5E, a protective film 118 provided with a second pad contact hole 158b and a first pixel contact hole 120 is formed on the interlayer insulating film 116 provided with the source electrode 108, the drain electrode 110, the storage upper electrode 144, the second pad electrode 154 and the low voltage supply line 160.

In more detail, the protective film 118 is formed by depositing an inorganic insulating material, such as $SiO_x$ or $SiN_x$, on the entire surface of the interlayer insulating film 116 provided with the source electrode 108, the drain electrode 110, the storage upper electrode 144, the second pad electrode 154 and the low voltage supply line 160. Thereafter, the protective film 118 is selectively patterned through a photolithography process and an etching process using a fifth mask, thus forming the second pad contact hole 158b and the first pixel contact hole 120. The second pad contact hole 158b and the first pixel contact hole 120 are formed through the protective film 118, thus exposing the drain electrode 110 and the second pad electrode 154.

Figure 5F:
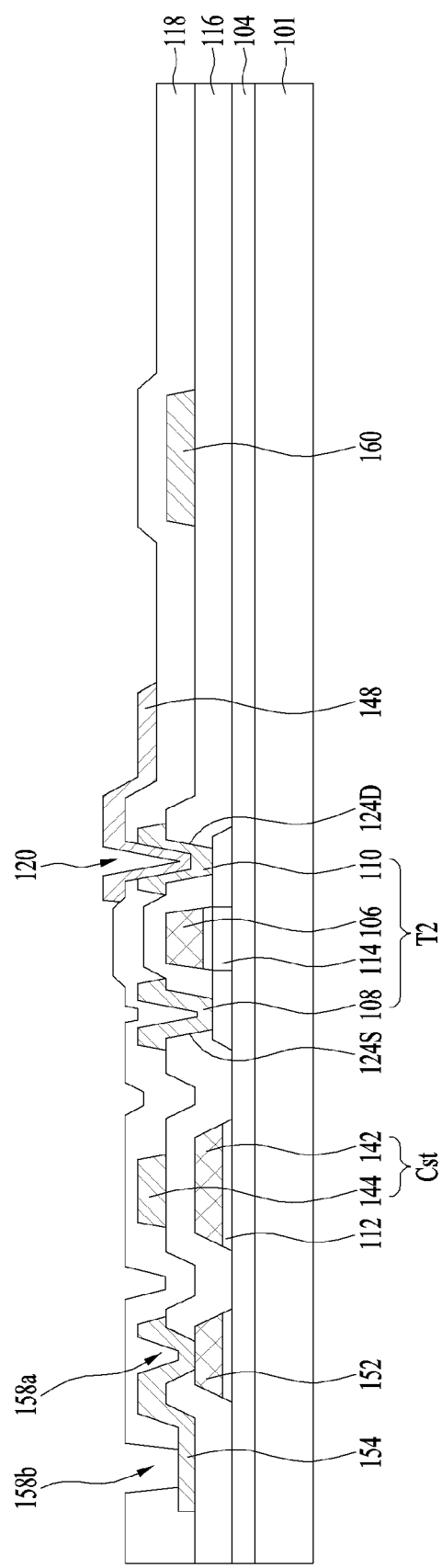

With reference to FIG. 5F, a pixel connection electrode 148 is formed on the substrate 101 provided with the protective film 118 having the second contact hole 158b and the first pixel contact hole 120.

In more detail, a connection metal layer is formed on the substrate 101 provided with the protective film 118 having the second contact hole 158b and the first pixel contact hole 120 through a deposition method, such as sputtering. Thereafter, the connection metal layer is patterned through a photolithography process and an etching process using a sixth mask, thus forming the pixel connection electrode 148.

Figure 5G:
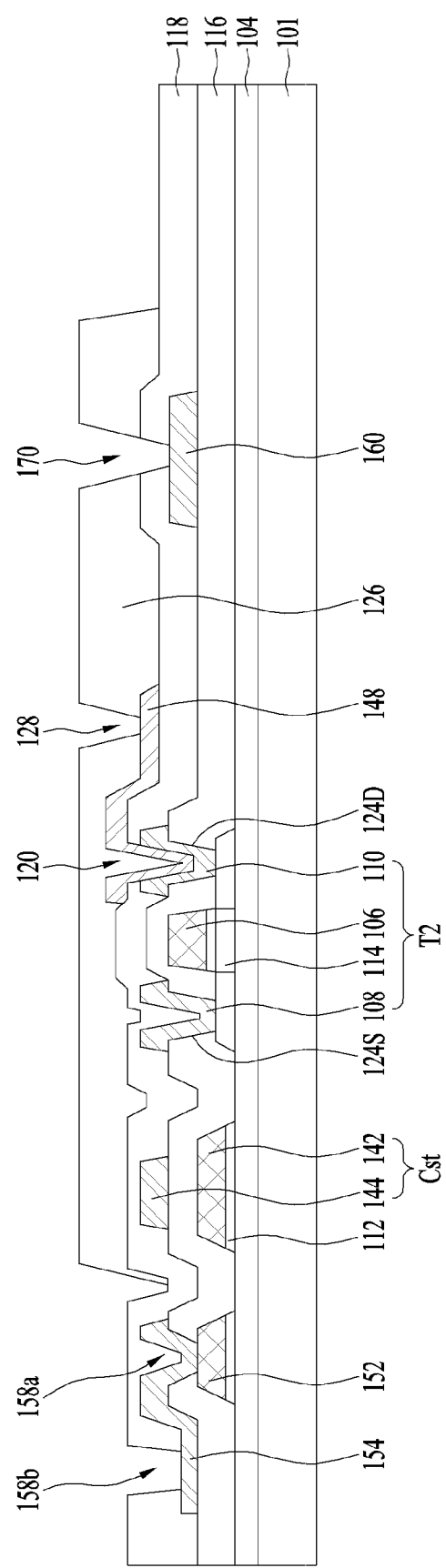

With reference to FIG. 5G, a planarization layer 126 having a second pixel contact hole 128 and an auxiliary contact hole 170 is formed on the substrate 101 provided with the pixel connection electrode 148.

In more detail, the planarization layer 126 is formed by stacking a photosensitive organic insulating material, such as photoacryl, on the substrate 101 provided with the pixel connection electrode 148. Thereafter, the planarization layer 126 is patterned through a photolithography process using a seventh mask, thus forming the second pixel contact hole 128 and the auxiliary contact hole 170.

Figure 5H:
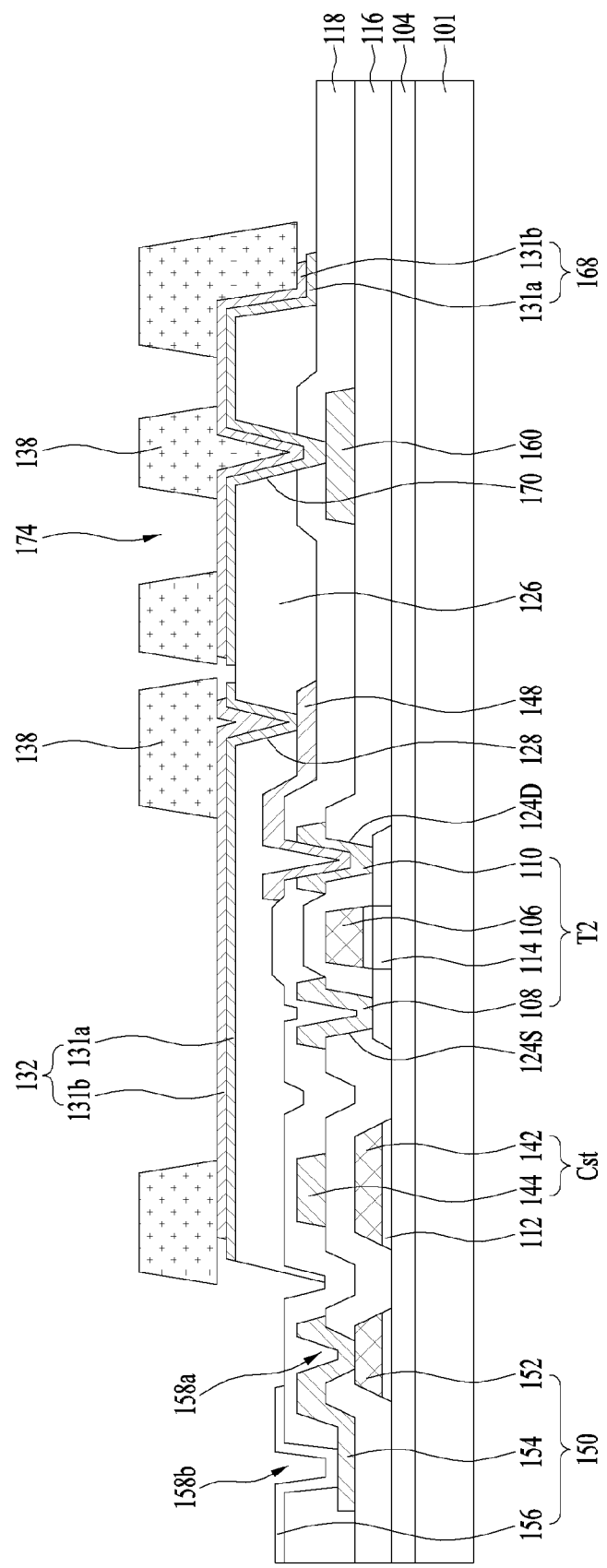

With reference to FIG. 5H, an anode 132, an auxiliary connection electrode 168, a pad cover electrode 156 and a bank 138 are formed on the substrate 101 provided with the planarization layer 126 having the second pixel contact hole 128 and the auxiliary contact hole 170 through the same mask process. This will be described below with reference to FIGS. 6A to 6D.

Figure 6A:
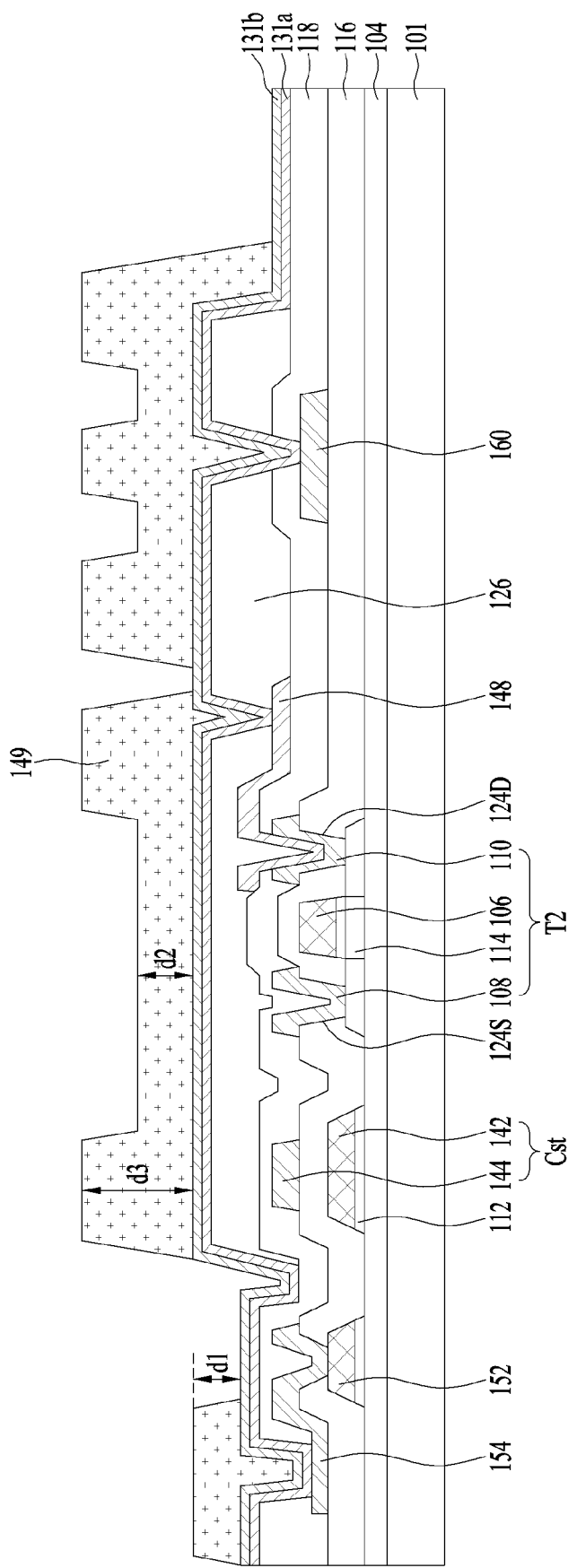
FIGS. 6A to 6D are cross-sectional views illustrating a method of manufacturing an anode, an auxiliary connection electrode, a pad cover electrode and a bank shown in FIG. 5H.

As exemplarily shown in FIG. 6A, a lower conductive film 131a and an upper conductive film 131b are sequentially formed on the substrate 101 provided with the planarization layer 126 having the second pixel contact hole 128 and the auxiliary contact hole 170. Here, the lower conductive film 131a is formed of a material which is not corroded by oxygen and moisture, even if the lower conductive film 131a is exposed to the outside, and is not damaged during etching of the upper conductive film 131b. For example, the lower conductive film 131a may be formed of one selected from the group consisting of molybdenum-titanium (MoTi), titanium (Ti), tantalum (Ta) and combinations thereof. The upper conductive film 131b has a multilayer structure including a transparent conductive film and an opaque conductive film having high reflection efficiency. The transparent conductive film is formed of a material having a comparatively high work function value, such as indium-tin-oxide (ITO) or indium-zinc-oxide (IZO), and the opaque conductive film is formed to have a single layer structure or a multilayer structure including Al, Ag, Cu, Pb, Mo, Ti or an alloy thereof. For example, the upper conductive film 131b may be formed to have a structure in which a transparent conductive film, an opaque conductive film and a transparent conductive film are sequentially stacked, or a structure in which a transparent conductive film and an opaque conductive film are sequentially stacked.

Thereafter, a photosensitive film is stacked on the upper conductive film 131b and is then patterned through a photolithography process using an eighth mask, such as a multi-tone mask, thus forming a multi-step photosensitive film 149. The multi-step photosensitive film 149 is formed to have a first thickness d1 in a region where the pad cover electrode 156 will be formed, is formed to have a second thickness d2 greater than the first thickness d1 in a region where the anode 132 and the auxiliary connection electrode 168 will be formed, and is formed to have a third thickness d3 greater than the second thickness d2 in a region where the bank 138 will be formed. The multi-step photosensitive film 149 is not formed in regions between anodes 132, between auxiliary connection electrodes 138, between pad cover electrodes 156, and between the anode 132 and the auxiliary connection electrode 138.

Figure 6B:
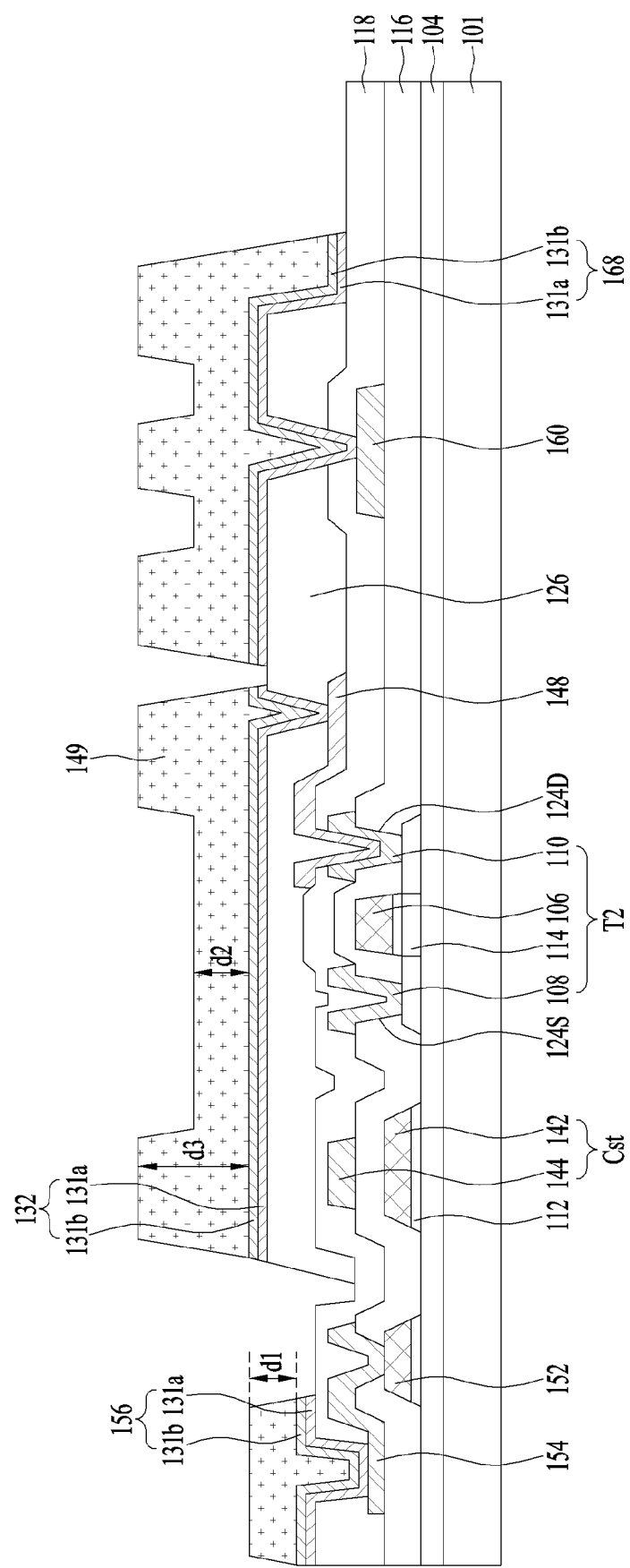
Figure 6C:
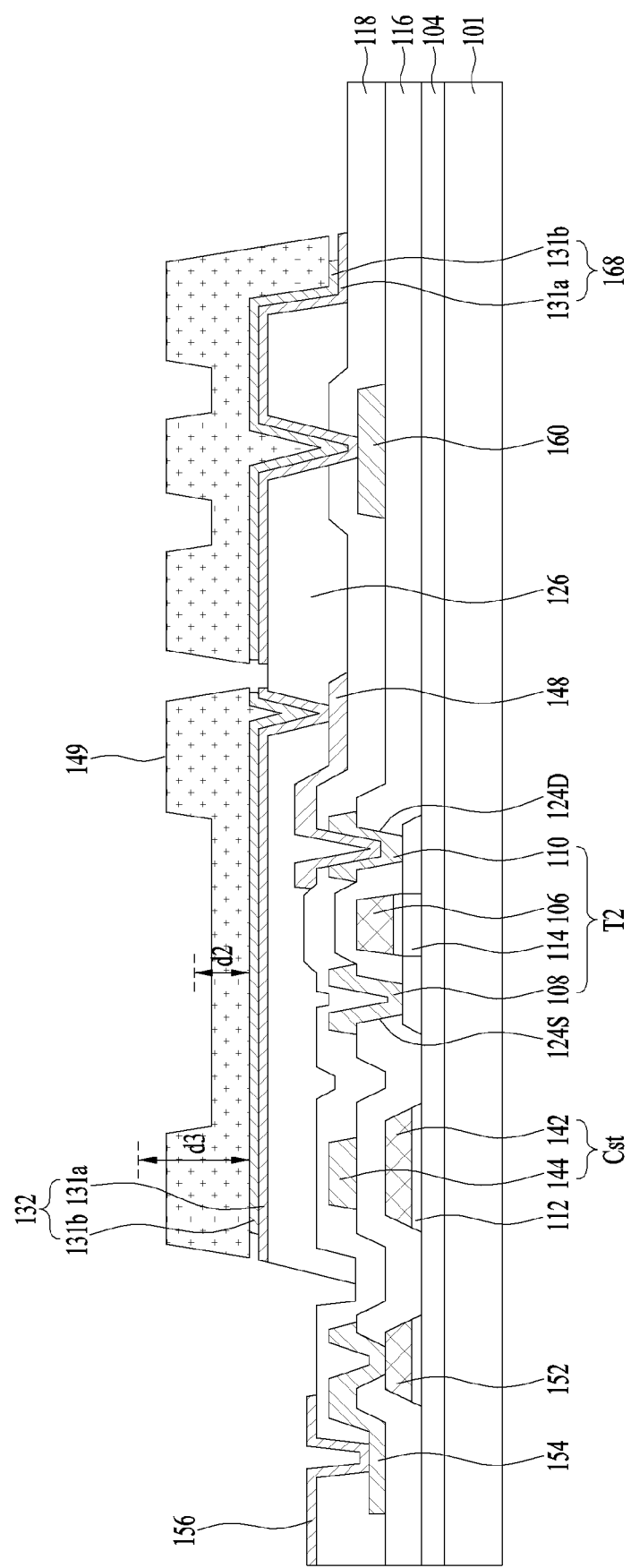

By etching the upper conductive film 131b and the lower conductive film 131a through an etching process using the multi-step photosensitive film 149 as a mask, the anode 132, the auxiliary connection electrode 168 and the pad cover electrode 156 are formed to have a multilayer structure including the upper conductive film 131b and the lower conductive film 131a, as exemplarily shown in FIG. 6B. Thereafter, the multi-step photosensitive film 149 is primarily ashed so that the overall thickness of the photosensitive film 149 is reduced and thus the region of the photosensitive film 149 having the first thickness d1 is removed, as exemplarily shown in FIG. 6C, thus exposing the upper conductive film 131b of the pad cover electrode 156. Thereafter, the upper conductive film 131b is removed through an etching process using the primarily ashed multi-step photosensitive film 149 as a mask and, thus, the pad cover electrode 156 includes the lower conductive film 131a alone and the lower conductive film 131a of each of the anode 132 and the auxiliary connection electrode 168 and the photosensitive film 149 protrude more than the side surface of the upper conductive film 131b of each of the anode 132 and the auxiliary connection electrode 168.

Figure 6D:
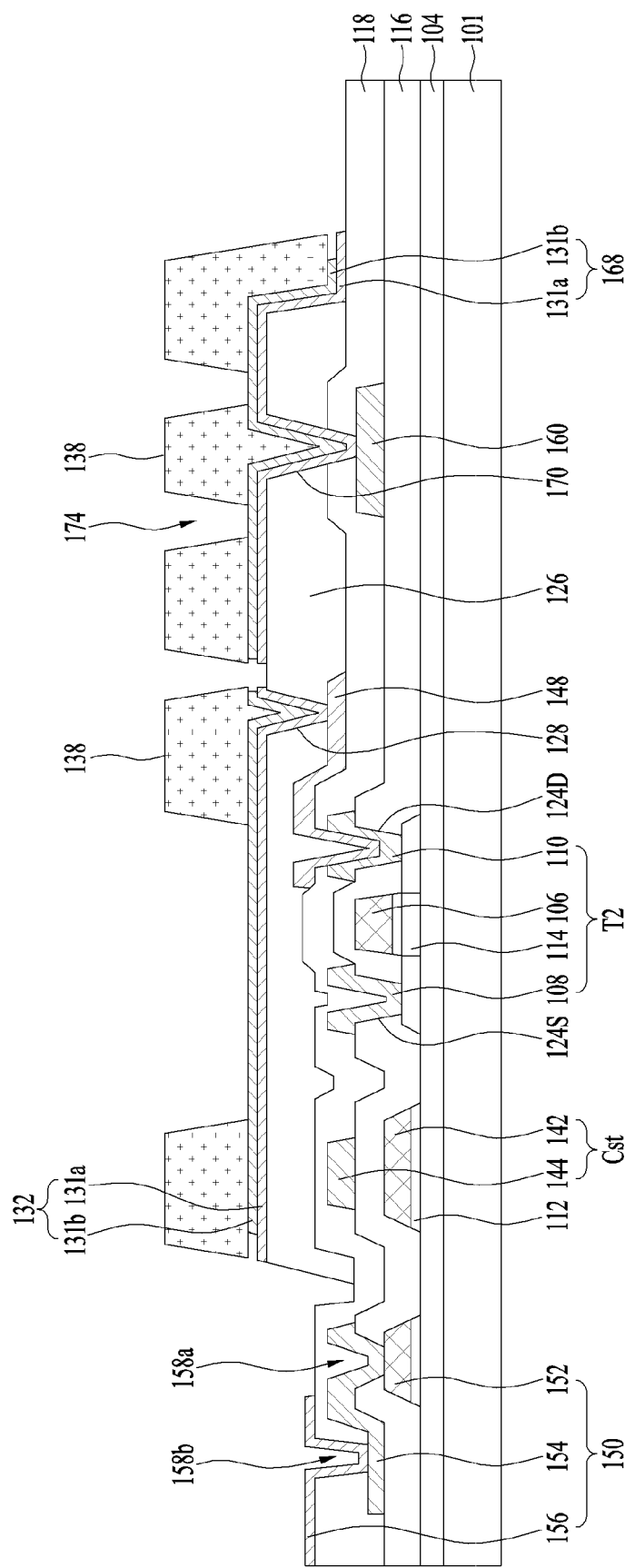

Thereafter, the multi-step photosensitive film 149 is secondarily ashed and, thus, the overall thickness of the photosensitive film 149 is reduced, as exemplarily shown in FIG. 6D. Therefore, the photosensitive film 149 is removed from the upper surfaces of the anode 132 and the auxiliary connection electrode 168 so that the anode 132 and the auxiliary connection electrode 168 are exposed, and the remaining photosensitive film 149 serves as the bank 138.

Figure 5I:
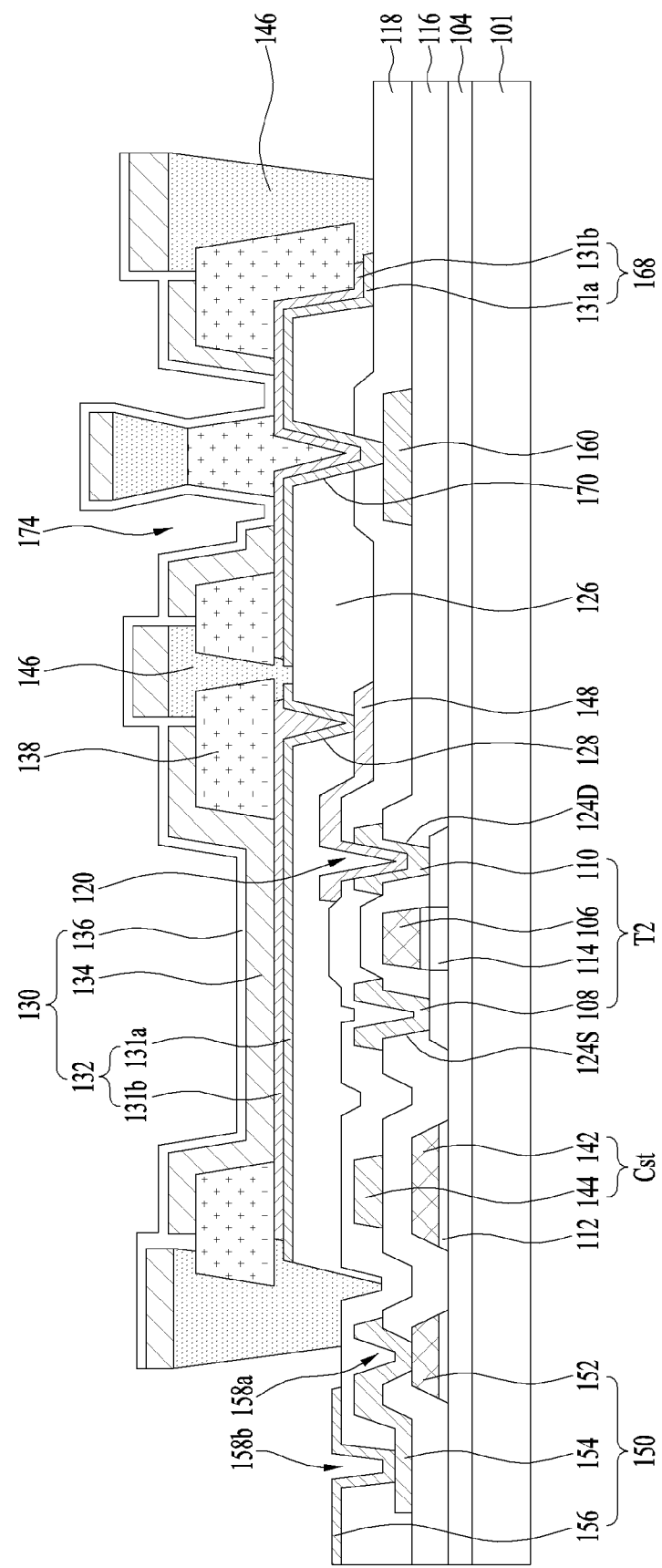

With reference to FIG. 5I, partitions 146, an organic light emitting stack 134 and a cathode 136 are sequentially formed on the substrate 101 provided with the anode 132, the auxiliary connection electrode 168, and the pad cover electrode 156 and the bank 138.

In more detail, a photosensitive film for partitions is applied to the entire surface of the substrate 101 provided with the bank 138 and is then patterned through a photolithography process using a ninth mask, thus forming the partitions 146. Thereafter, the organic light emitting stack 134 and the cathode are sequentially formed in the active area except for the pad area through a deposition process using a shadow mask.

As such, in the present disclosure, formation of the anode 132, the auxiliary connection electrode 168, the pad cover electrode 156 and the bank 138 and exposure of the pad cover electrode 156 are carried out through one mask process. Further, in the present disclosure, when the upper and lower conductive films 131a and 131b forming the anode 132 are etched, the pad cover electrode 156 is protected by the photosensitive film 149 used in formation of the pad cover electrode 156 and, thus, damage to the pad cover electrode 156 by an etching solution or etching gas of the anode 132 may be prevented without a separate pad protective film. Therefore, the method for manufacturing an organic light emitting display device in accordance with the present disclosure may decrease the number of times that the mask process is performed by at least three times, as compared to a conventional method, and may thus simplify a structure and a manufacturing process of the organic light emitting display device and improve productivity of the organic light emitting display device.

If the organic light emitting display device in accordance with the present disclosure has a front view type light emitting structure, the organic light emitting display device further includes a color filter array including a black matrix and color filters on a second substrate. In this case, white light emitted from the light emitting element 130 exits toward the front surface of the second substrate through the color filters, thus displaying an image.

As apparent from the above description, in an organic light emitting display in accordance with the present disclosure, formation of an anode, an auxiliary connection electrode, a pad cover electrode and a bank and exposure of the pad cover electrode are carried out through one mask process. Further, when upper and lower conductive films forming the anode are etched, the pad cover electrode is protected by a photosensitive film used in formation of the pad cover electrode and, thus, damage to the pad cover electrode by an etching solution or etching gas of the anode may be prevented without a separate pad protective film. Therefore, the organic light emitting display device in accordance with the present disclosure may decrease the number of times that the mask process is performed by at least three times, as compared to a conventional organic light emitting display device, and may thus have a simplified structure and manufacturing process and improve productivity.

It will be apparent to those skilled in the art that various modifications and variations can be made in the present invention without departing from the spirit or scope of the disclosure. Thus, it is intended that the present disclosure cover the modifications and variations of this disclosure provided they come within the scope of the appended claims and their equivalents.

What is claimed is:

1. An organic light emitting display device comprising:
   thin film transistors disposed on a substrate;
   organic light emitting elements connected to the thin film transistors, each of the organic light emitting elements comprising a first layer of an organic light emitting material, the first layer of the organic light emitting material configured to emit light when current is provided through a corresponding thin film transistor;
   an auxiliary connection electrode connected to a cathode of each of the organic light emitting elements;
   a first bank disposed along an edge of an anode of each of the organic light emitting elements;
   a second bank disposed along an edge of the auxiliary connection electrode;
   a partition with a reverse tapered shape disposed to cover a side surface of the anode,
      wherein the partition is between the anode and the auxiliary connection electrode,
      wherein a portion of the cathode separates the first layer of the organic light emitting material from the partition,
      wherein an upper surface of the partition is wider than a lower surface of the partition, and
      wherein a side surface of the first bank protrudes more than the side surface of the anode, the anode disposed under the first bank;
         a side surface of the second bank protrudes more than a side surface of the auxiliary connection electrode, the auxiliary connection electrode disposed under the second bank; and
         the cathode directly contacts an upper surface and the side surface of the auxiliary connection electrode; and
   a second layer of the organic light emitting material at least partially on the upper surface of the partition and separated from the first layer of the organic light emitting material.

2. The organic light emitting display device according to claim 1, wherein:
   the partition is disposed to cover the side surface of the anode.

3. The organic light emitting display device according to claim 1, wherein:
   at least one of the anode and the auxiliary connection electrode is formed by sequentially stacking a lower conductive film and an upper conductive film having a multilayer structure;
   the lower conductive film is formed of one selected from the group consisting of MoTi, Ti, Ta and combinations thereof; and
   the upper conductive film includes a transparent conductive film formed of ITO and an opaque conductive film formed of Ag or an Ag alloy.

4. The organic light emitting display device according to claim 3, wherein the side surface of the first bank and a side surface of the lower conductive film protrude more than a side surface of the upper conductive film.

5. The organic light emitting display device according to claim 3, further comprising:
   pad electrodes disposed in a pad area of the substrate; and
   a pad cover electrode connected to a corresponding one of the pad electrodes and including the lower conductive film.

6. The organic light emitting display device according to claim 3, further comprising a storage capacitor formed by overlapping a storage lower electrode and a storage upper electrode,
   wherein the storage lower electrode is formed of a same material as a gate electrode of each of the thin film transistors, and wherein the storage upper electrode is formed of the same material as a source electrode of each of the thin film transistors and disposed coplanar with the source electrode.

7. The organic light emitting display device according to claim 1, further comprising:
a third bank, a second partition, and a third layer of the organic light emitting material sequentially stacked on the auxiliary connection electrode.

\* \* \* \* \*